(12) United States Patent
Mohamed et al.

(10) Patent No.: US 7,656,978 B2
(45) Date of Patent: Feb. 2, 2010

(54) FAST Q-FILTER

(75) Inventors: Magdi A. Mohamed, Schaumburg, IL (US); Tom Mathew, Skokie, IL (US); Irfan Nasir, Lake In The Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 539 days.

(21) Appl. No.: 11/554,689

(22) Filed: Oct. 31, 2006

(65) Prior Publication Data

US 2008/0101512 A1    May 1, 2008

(51) Int. Cl.
*H04B 1/10* (2006.01)
(52) U.S. Cl. ............... 375/350; 382/224; 702/190; 708/300; 713/189
(58) Field of Classification Search ......... 382/224; 702/190; 708/300; 713/189; 375/350
See application file for complete search history.

(56) References Cited

U.S. PATENT DOCUMENTS 7,117,128 B2 * 10/2006 Mohamed et al. ......... 702/190

2005/0278150 A1 * 12/2005 Mohamed et al. ......... 702/190
2006/0195499 A1 *  8/2006 Xiao et al. ............... 708/300
2008/0155270 A1 *  6/2008 Mohamed et al. ......... 713/189
2008/0247652 A1 * 10/2008 Mohamed et al. ......... 382/224

OTHER PUBLICATIONS

Magdi et al.; Q-Measures: An Efficient Extention of the Sugeno Lambda-Measure; IEEE Transcation on Fuzzy Systems, vol. 11, No. 3; Jun. 2003; pp. 419-426.*
Magdi et al.; Application of Q-Measure Techniques to Adaptive Nonlinear Digital Filtering; 2006 IEEE International Conference on Fuzzy Systems; Jul. 2006; pp. 1194-1199.*

* cited by examiner

*Primary Examiner*—Sudhanshu C Pathak

(57) ABSTRACT

An nonlinear digital signal processing filter (100, 200, 1100, 1308, 1310, 1312, 1346, 1604) maintains a magnitude ordering for successive windows of signal samples. A set of filter density generator values $[f_1, f_2, f_3 \ldots f_j \ldots f_{ndensities}]$ are used according to the ordering in a recursion relation that computes successive values of a set function over the set of filter density generator values. The recursion relation involves an adjustable nonlinearity defining parameter $\lambda$. The values are normalized by dividing by a largest of the values, and differences between successive values are taken. An inner product between each window of signal values (used in order according to magnitude) and the adaptive differences is a filtered signal sample.

18 Claims, 10 Drawing Sheets

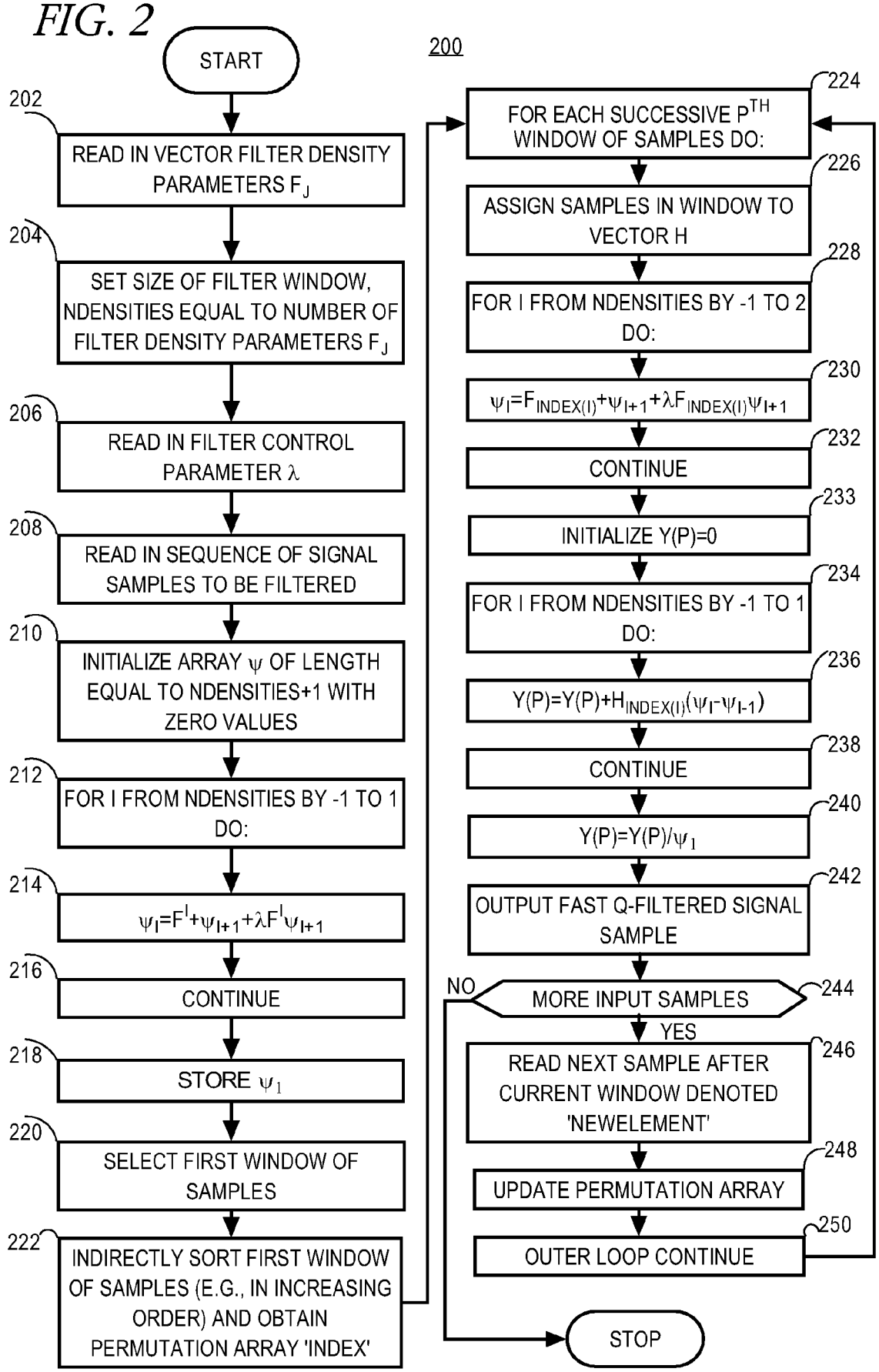

400

Yp reinitialized to zero for each window can put in block

500

FAST Q-FILTER

FIELD OF THE INVENTION

The present invention relates generally to adaptive nonlinear digital signal filtering.

BACKGROUND

Filters are a basic and important component of a variety of electrical systems. Among the broad categories of electrical systems that use filters are communication systems such as optical, electrical and wireless communication systems and sensor systems, such as medical diagnostic systems, fire detection systems, object tracking systems, wireless controllers, smart cameras, and smart phones. Other general time series data processing systems include financial predictors.

Filters are, broadly speaking, used to facilitate the extraction of information from captured signals or any input data stream. Conventional filters perform this task by suppressing noise, thereby increasing the Signal to Noise Ratio (SNR). Conventional filters are designed to pass certain frequencies and block other frequencies. Frequency bands that include desired information are passed and out of band noise energy is blocked. Originally, filters used linear analog circuits. Since the advent of digital electronics Digital Signal Processing (DSP) filters have come into widespread use. Conventional DSP filters are also designed to pass certain frequencies and reject other frequencies.

Q-filters are a new class of adaptive nonlinear digital filters that are used in place of one or more conventional DSP filters. Q-filters are described in co-pending patent application Ser. No. 10/854,836 by M. Mohamed et al. which is assigned to the assignee of the invention described herein. Q-filters operation and kernel parameter estimation are described in Magdi Mohamed et al., *Application of Q-Measures Techniques to Adaptive Nonlinear Digital Filtering*, 2006 IEEE INTERNATIONAL CONGRESS ON COMPUTATIONAL INTELLIGENCE, 2006 IEEE INTERNATIONAL CONFERENCE ON FUZZY SYSTEMS, in Vancouver, BC, Canada, Jul. 16-21, 2006. A Q-filter is defined as a Choquet integral of the input signal with respect to a Q-measure over a window of the input signal values. Q-measures are described in M. Mohamed, *Q-Measures: An Efficient Extension of the Sugeno Lambda-Measure*, IEEE TRANSACTIONS ON FUZZY SYSTEMS, Vol. 11, No. 3, June 2003.

Although the Q-filters described in the previous work are versatile and work well, they include threshold stages and are somewhat more complicated then traditional DSP filters. In the interest of reducing processing time and lowering battery consumption in battery operated devices that include Q-filters, it would be desirable to provide more efficient implementation of Q-filters.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 2 shows a flowchart of a software implementation of a fast Q-filter according to an embodiment of the invention;

Figure 1:
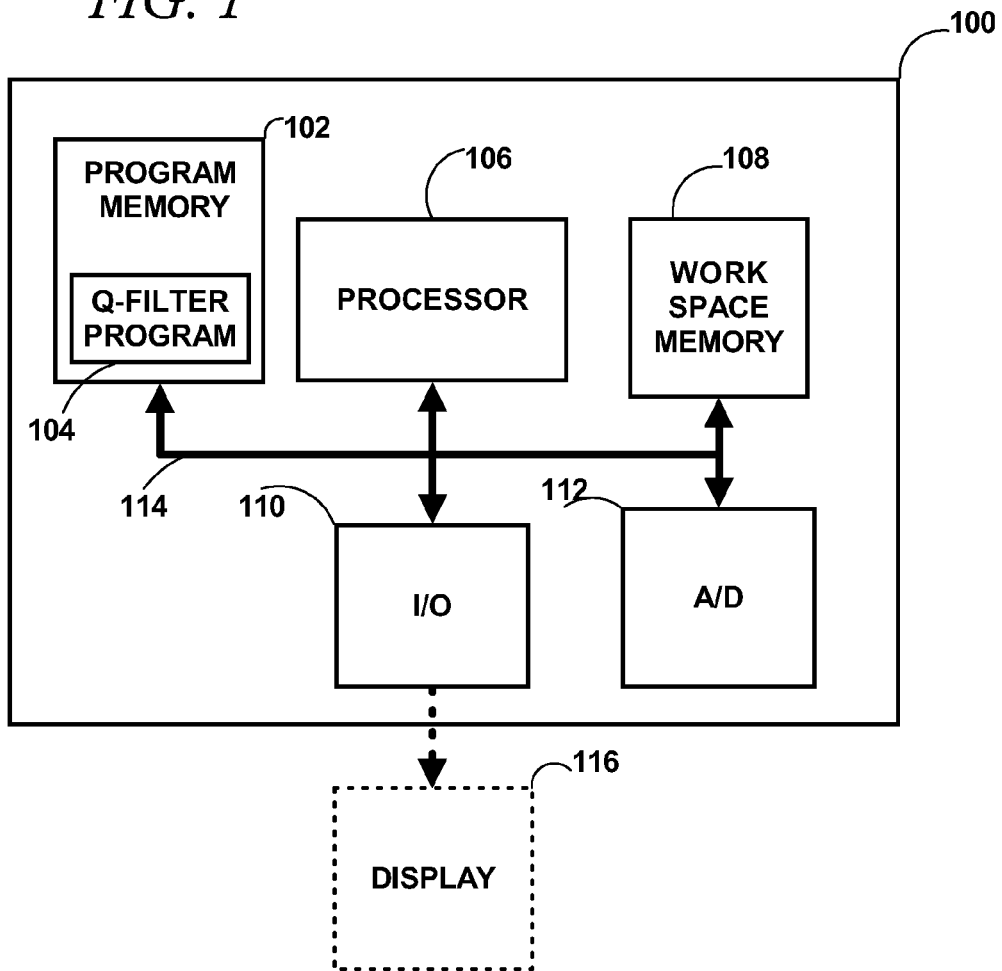
FIG. 1 is a block diagram of a programmed processor implementation of a fast Q-filter according to an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to adaptive nonlinear digital signal filtering. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of adaptive nonlinear digital signal filtering described herein. The non-processor circuits may include, but are not limited to, a radio receiver, a radio transmitter, signal drivers, clock circuits, power source circuits, and user input devices. As such, these functions may be interpreted as steps of a method to perform adaptive nonlinear digital signal filtering. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

FIG. 1 is a block diagram of a programmed processor implementation of a fast Q-filter 100 according to an embodiment of the invention. The fast Q-filter 100 comprises a program memory 102 including a fast Q-filter program 104, a processor 106 (e.g., a DSP), a workspace memory 108, an Input/Output interface (I/O) 110, and an Analog-to-Digital converter (A/D) 112, coupled together through a signal bus 114. Input signals, in analog form, are received through the A/D 112. Alternatively, digitized input signals are received through the I/O 110. Filtered signals are output through the I/O 110. An optional display 116 that is coupled to the I/O 110 can be used to view filtered signals. (In many applications, such as certain control systems, there is no need to display the actual filtered signal). A version of the fast Q-filter program according to an embodiment of the invention is described below with reference to FIGS. 2-3. The program memory 102 is a form of computer readable media. Alternative types of program memory include magnetic media, optical media, and solid state memory, for example.

Figure 3:
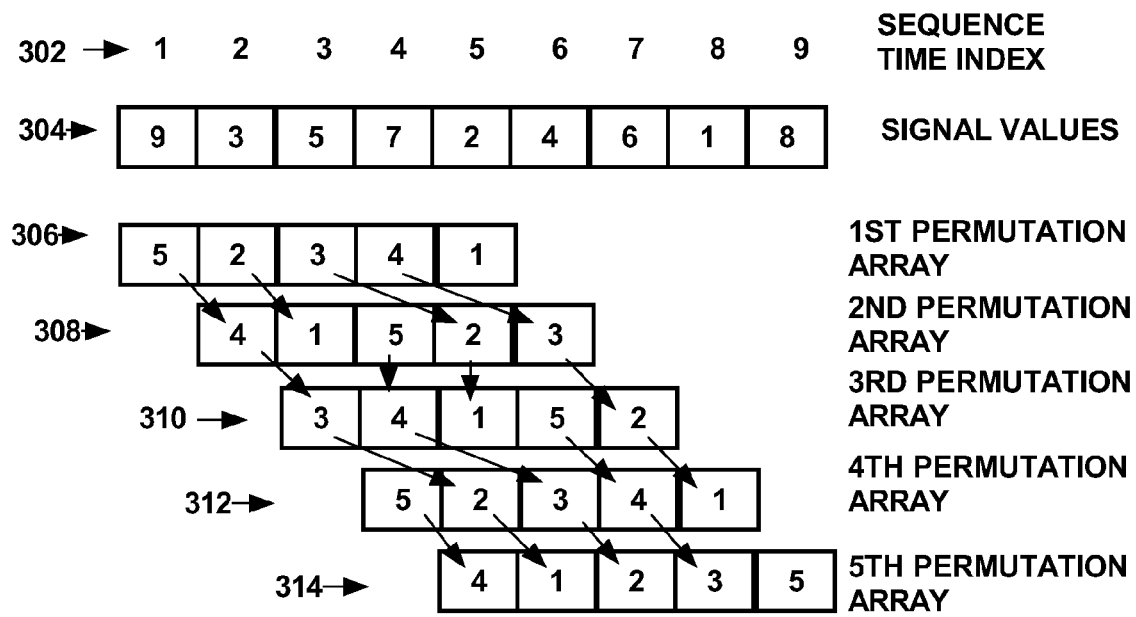
FIG. 3 illustrates updating of a permutation array by the fast Q-filter software shown in FIGS. 2-3.

FIGS. 2-3 show a flowchart 200 of a software implementation of a fast Q-filter according to an embodiment of the invention. In block 202 a vector of filter density generator parameters denoted $[f_1, f_2, f_3 \ldots f_j \ldots f_{ndensities}]$ are read, e.g., from the program memory. The number ndensities of parameters in the vector is also equal to a window size used in processing signal samples. In block 204 the size of the filter window is set equal to ndensities. In block 206 an additional filter nonlinearity control parameter denoted $\lambda$ is read in. The additional nonlinearity control parameter $\lambda$ along with the filter density generator parameter vector $F=[f_1, f_2, f_3, f_j \ldots f_{ndensities}]$ define a fast Q-filter.

In block 208 a sequence of signal samples is read. In practice the fast Q-filter 100 can be used to process a signal in real time, in which case execution of block 208 will continue concurrently with subsequent fast Q-filter processing blocks described below. Alternatively, the fast Q-filter 100 is used to process signals that were acquired through a data acquisition system and previously stored, in which case all the signal samples can be read in block 208 before subsequent fast Q-filter processing blocks are executed.

In block 210 an array of derived filter parameters $[\Psi_1, \Psi_2, \Psi_3 \ldots \Psi_j \ldots \Psi_{ndensities+1}]$ is initialized with zero values. Block 212 is the beginning of a program loop that includes blocks 212-216. A loop counter l is initialized at ndensities and is decremented after each pass through the program loop 212-216. Within the loop 212-216 in block 214 a recursion relation that determines each $i^{th}$ derived adaptive filter parameter $\Psi_i$ based on an $(l+1)^{th}$ derived filter parameter $\Psi_{i+1}$ and the $i^{th}$ filter density generator parameter $f_i$ is evaluated. The recursion relation is given by:

$$\Psi_i F(i)+\Psi_{i+1}+\lambda F(i)\Psi_{i+1}, \qquad \text{EQU. 1}$$

where, $F(i) \in [0,1]$, $i=1, \ldots n$;

$-1 <= \lambda$, and $\Psi_{n+1}=0$.

In equations one the notation $F(i)$ is used instead of $f_i$ without implying any change in meaning.

Block 216 marks the end of the loop 212-216. The purpose of the loop of blocks 212-216 is to calculate the first derived filter parameter $\Psi_1$ which is used to normalize the output of the fast Q-filter 100. In block 218 the first derived filter parameter $\Psi_1$ is stored, e.g., in the work space memory 108.

In block 220 a first window of signal samples is selected from the signal samples read in block 208. In block 222 an indirect sort is performed on the first window of samples in order to obtain a permutation array, denoted 'Index'. (For complex-valued signals, separate fast Q-filters can be used for the real component and imaginary component. Alternatively, one fast Q-filter can be used for the magnitude component and another for the angular component). In the context of FIGS. 2-3 the indirect sort yields a permutation array that specifies a monotonic increasing order. FIG. 3 illustrates certain points related to the permutation array. Referring to FIG. 3 the first row 302 is a sequence of signal sample numbers. If the signal being filtered is a time-varying signal, then each of the signal sample numbers is a time index. A time varying signal is typically sampled at a certain periodic rate and each sample can be referred to by a new time index. Time indexes one to nine are shown for illustration. The second row 304 in FIG. 3 shows hypothetical actual signal values. The third row 306 in FIG. 3 is a permutation array for the first window, which in the context of FIG. 3 is assumed to be five samples long. The entries in the permutation array are sample window position numbers. In the permutation array, the position numbers are arranged in order according to the magnitude of the corresponding signal samples. Thus, the first entry in the permutation array shown in the third row 306 is five which refers to the smallest signal sample in the first window which has a magnitude of two. Similarly the next entry in the permutation array 306 is two which refers to the next larger signal sample in the first window which has a magnitude of three, and so on. Efficient methods of maintaining the permutation array which contribute to the speed and efficiency of the fast Q-filter are described below in more detail with reference to FIGS. 7-10.

Referring again to FIG. 2 block 224 is the beginning of a large outer program loop that processes successive windows of samples. In FIG. 2 an index P refers to successive windows. The large program loop includes blocks 224-250 in FIG. 2. In block 226 the samples in the current window are assigned to a vector H. Block 228 is the start of an inner loop that includes blocks 228-232. This program loop is similar to the program loop made up of blocks 212-216 described above. In blocks 228-232 the derived filter parameters [$\Psi_1, \Psi_2, \Psi_3 \ldots \Psi_{ndensities+1}$] are recalculated using the same recursion relation, but using the filter density generator parameters [$f_1, f_2, f_3 \ldots f_j \cdot f_{ndensities}$] in an order determined by the permutation array. The recursion relation altered to used the order determined by the permutation array is given by:

$$\Psi_i = F(\text{Index}(i)) + \Psi_{i+1} + \lambda F(\text{Index}(i))\Psi_{i+1}, i=1, \ldots, n, \text{ and } \Psi_{n+1}=0. \quad \text{EQU. 2}$$

(Recall that Index is the permutation array.)

Block 232 marks the end of the loop commenced in block 228.

In block 233 a variable Y(P) for a filtered output derived from the $P^{TH}$ window is initialized to zero. Block 234 is a beginning of yet another program loop that is ends in block 238. Within this program loop, in block 236 the filtered output Y(P) derived from the first window is accumulated. During each $i^{th}$ iteration of the loop 234-238 an output value Y(P) (initially zero for each sample window) is incremented according to the following formula:

$$Y(P) = Y(P) + H_{index(i)}(\Psi_i - \Psi_{i-1}) \quad \text{EQU. 3}$$

The effect of the program loop 234-228 is to compute the inner product between the signal values of a current window which are taken in order according to magnitude and the sequence of differences ($\Psi_i - \Psi_{i-1}$).

In block 240 the output value Y(P) of the Q-filter output is normalized by dividing by $\Psi_1$. In block 242 a fast Q-filtered signal sample is output.

Blocks 202-222 which precede the large program loop partially complete processing of the first window of samples. Within the large program loop a first sequence blocks 226-242 complete processing of the first window of samples and complete processing of successive windows of samples, and a second sequence of blocks 244-250 begin processing of each next window of signal samples.

Block 244 is a decision block, the outcome of which depends on whether there are more signal samples to be processed, e.g., whether a signal being sampled to produce signal samples is still active. If the outcome of block 244 is negative then processing terminates. On the other hand if the outcome of block 244 is positive then in block 246 a next sample is read. The next sample is denoted 'newelement'.

After block 246 in block 248 the permutation array is updated. Fast and efficient methods for updating the permutation array are described below with reference to FIGS. 7-10. Block 250 is a continuation block for the outer loop.

Figure 4:
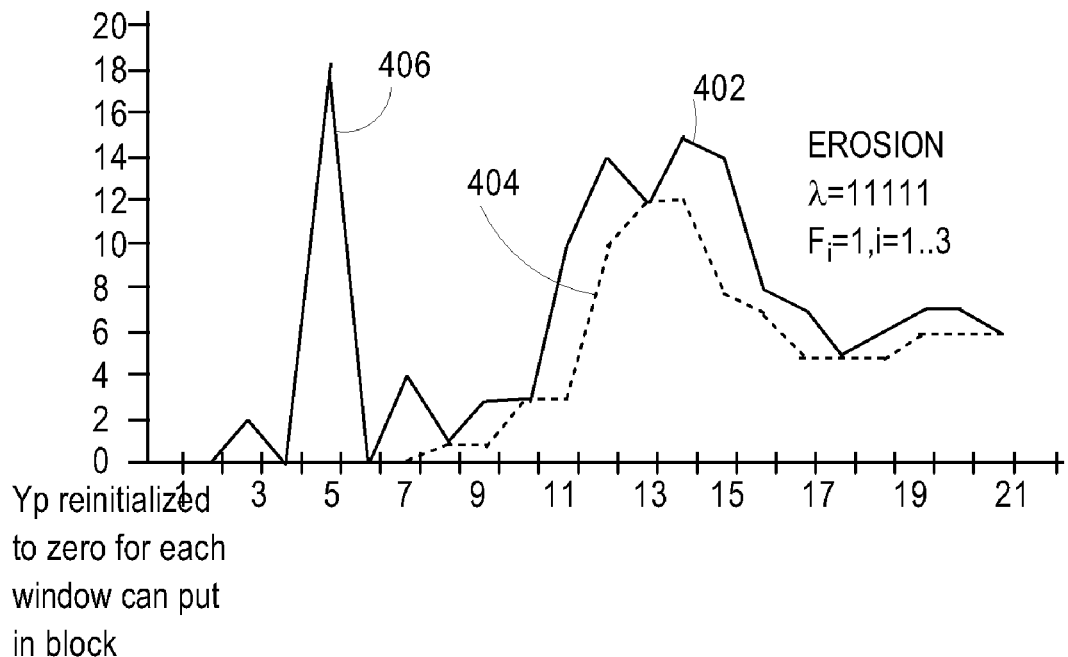
FIG. 4 is a first signal plot showing an unfiltered signal along with a filtered signal obtained by filtering the unfiltered signal with a fast Q-filter configured to emulate an erosion filter.

FIG. 4 is a first signal plot 400 showing an unfiltered signal 402 and along with a filtered signal 404 obtained by filtering the unfiltered signal 402 with a fast Q-filter (e.g., 100) configured to emulate an erosion filter. The window size was three. To obtain the filter signals shown in FIGS. 4-6 the filter density generator parameters $f_1, f_2, f_3$ where set equal to one. In the case of the FIG. 4 λ was set equal to 1111. Note that the unfiltered signal 402 includes a noise spike 406 that is eliminated from the filtered signal 404. The fast Q-filter configured as an erosion filter also generally reduces the signal energy.

Figure 5:
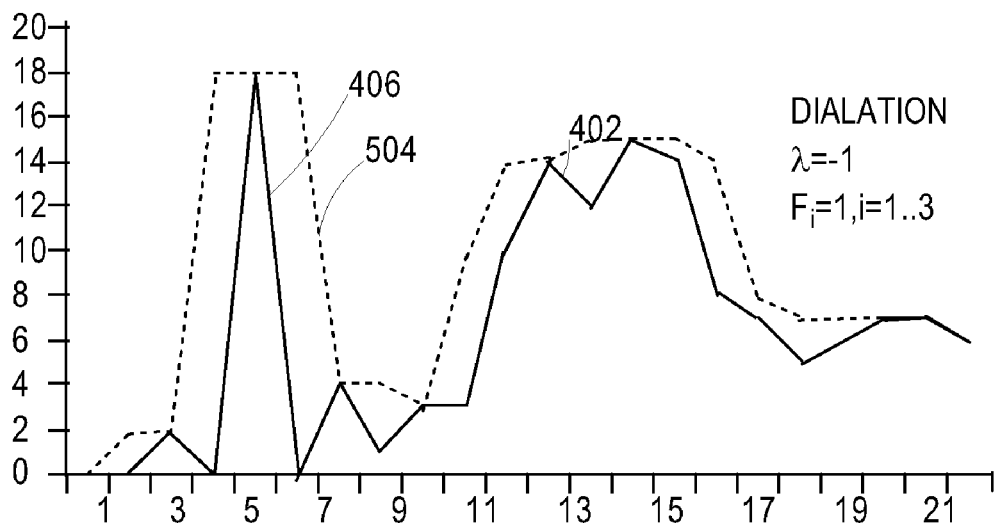
FIG. 5 is a second signal plot showing the unfiltered signal along with a filtered signal obtained by filtering the unfiltered signal with a fast Q-filter configured to emulate a dilation filter.

FIG. 5 is a second signal plot 500 showing the unfiltered signal 402 and along with a filtered signal 504 obtained by filtering the unfiltered signal 402 with a fast Q-filter configured to emulate a dilation filter. In order to configure the fast Q-filter to emulate a dilation filter λ was set equal to minus one. The fast Q-filter configured as a dilation filter increases the signal energy and the energy in the noise spike 406.

Figure 6:
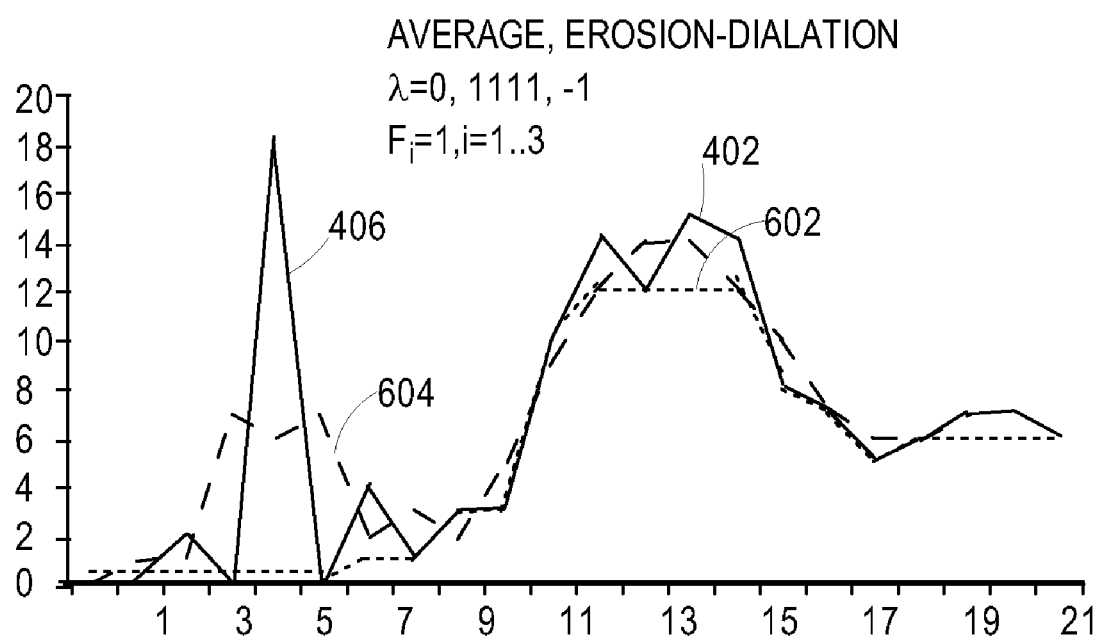
FIG. 6 is a third signal plot showing the unfiltered signal along with one filtered signal obtained by filtering the unfiltered signal with two fast Q-filters configured to emulate an opening filter and one filtered signal obtained by filtering with a fast Q-filter configured to function as an averaging filter.

FIG. 6 is a third signal plot 600 showing the unfiltered signal 402 along with one filtered signal 602 obtained by filtering the unfiltered signal with two fast Q-filter configured to emulate an opening filter and one filtered signal 604 obtained by filtering with a fast Q-filter configured to function as an averaging filter. An opening filter is emulated by a first fast Q-filter stage configured to emulate an erosion filter (e.g., with λ=1111), followed by a second fast Q-filter stage configured to emulate a dilation filter (e.g., with λ=−1). Two fast Q-filter configured to emulate an opening filter serve to remove the noise spike and substantially restore the signal energy of the unfiltered signal 402. A fast Q-filter is adapted to act as an averaging filter by setting λ equal to zero. Although the fast Q-filter adapted as an averaging filter reduce the amplitude of the noise spike it is not completely eliminated. Thus at the expense of the added complexity of providing two fast Q-filters in series a filter system that may be better able to handle noise is provided. By also allowing λ and the filter density generator parameters [$f_1, f_2, f_3 \ldots f_j \ldots f_{ndensities}$] to vary the fast Q-filters can be configured to cover a new space of filter designs that includes the averaging filter as a special case, can emulate morphological filters such as the erosion filter, the dilation filter, the opening filter and the closing filter but also includes new types of filters that are intermediate the know types of filters.

Figure 7:
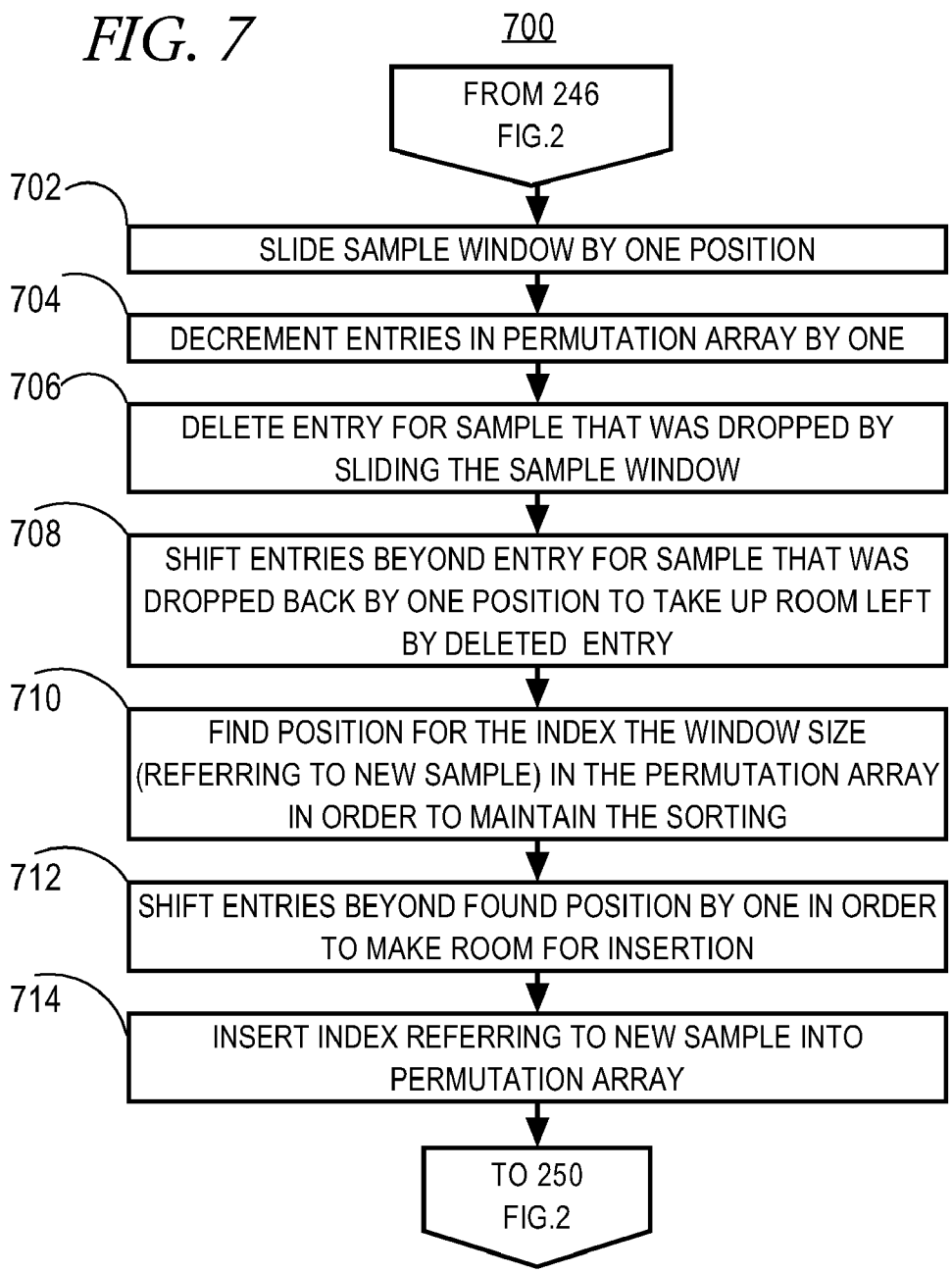
FIG. 7 is a high level flowchart of a sliding window indirect insertion sort that is used by the fast Q-filter.

FIG. 7 is a flowchart of a sliding window indirect insertion sort 700 that is used by the fast Q-filter, e.g., in block 248 of the software fast Q-filter shown in FIG. 2. The sliding window indirect insertion sort is useful in maintaining the permutation array in an efficient manner i.e., without requiring resorting each new window. The sliding window indirect sort is characterized by a polynomial time of O(n) as opposed to O(n log(n)) which characterizes sorting each window independently by known efficient prior art methods, e.g., the quick sort. At the start of the sort 700 it is assumed that an indirect sort of the first window has already been performed yielding an initial permutation array. A variety of methods, e.g., an indirect sort, can be used to sort the initial window of samples. In block 702 the sample window is slid by one position in order to drop one signal sample and pick up a new signal sample. In block 704 entries in the permutation array are decremented by one. In block 706 the entry for the sample that was dropped by sliding the window (i.e., an entry equal to one) is deleted. In block 708 the entries beyond the sample that was dropped are shifted back by one position to take up room left by the deleted entry. In block 710 the position in the permutation array for the entry referring to the sample added by shifting the window is located. In block 712 indexes beyond the position found in block 710 are shifted by one position in order to make room for insertion and in block 714 an entry (i.e., an index equal to the window size) referring to the sample added to the window by sliding the window is inserted in the position located in block 710.

Figure 8:
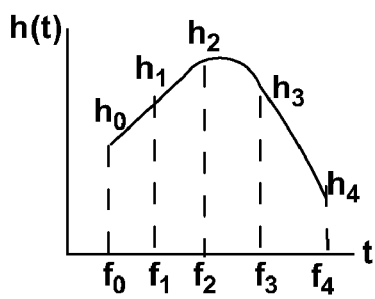
FIGS. 8-9 illustrate how signal samples and filter parameters are reordered by the fast Q-filter.
Figure 9:
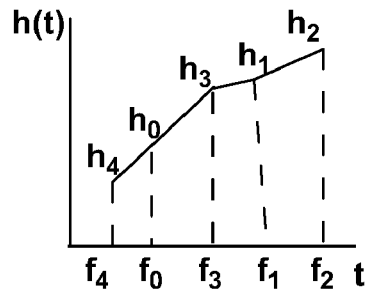

FIGS. 8-9 illustrate how signal samples and filter density generator parameters [$f_1, f_2, f_3 \ldots f_j \ldots f_{ndensities}$] are effectively reordered by the Q-filter. FIG. 8 is a plot of a signal covering a period of five signal samples labeled $h_0$ to $h_4$. Under the time-axis of the plot a sequence of filter density generator parameters $f_0$ to $f_4$ are shown. FIG. 9 shows a plot with the signal transformed so that the signal samples $h_0$ to $h_4$ appear in order of increasing magnitude. The filter density generator parameters $f_0$ to $f_4$ are shown in FIG. 9 reordered according to the same permutations required to order the signal samples $h_0$ to $h_4$ in increasing order.

Figure 10:
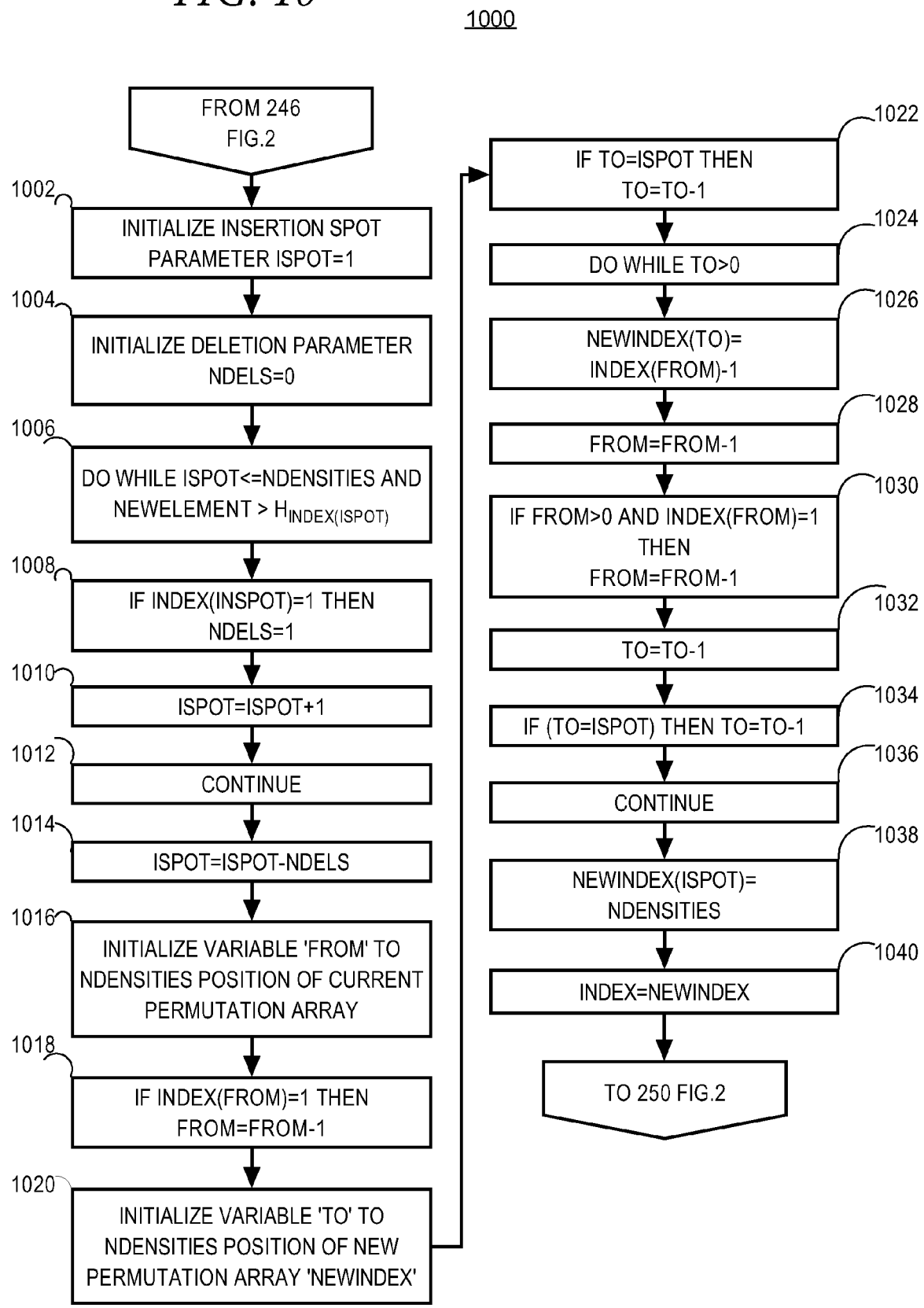
FIG. 10 is a flowchart of a sliding window indirect insertion sort that is used by the fast Q-filter according to an embodiment of the invention.

FIG. 10 is a flowchart 1000 of a sliding window indirect insertion sort that is used by the fast Q-filter (e.g., in block 248 of the software fast Q-filter shown in FIG. 2) according to an embodiment of the invention. As will be described blocks 1002-1040 serve to maintain the permutation array as each new window is formed by shifting the preceding window along the sequence of signal samples (e.g., the signal samples read in block 208). Note that each time the window is shifted a sample is dropped at one end of the window and another sample is added at an opposite end of the window. In block 1002 an insertion spot parameter denoted 'ispot' is initialized with a value of one. In block 1004 a deletion parameter denoted 'ndels' is initialized with a value of zero. Block 1008 begins a DO WHILE program loop that includes blocks 1006-1012 and continues execution while the insertion spot parameter is less than or equal to the window length 'ndensities' AND while the 'newelement' is greater than the element of the preceding window of samples that is referenced by the index which is the element of the permutation array referenced by the current value of the insertion spot parameter 'ispot'. Per the latter condition, a insertion spot that maintains a monotonically increasing ordering is sought. The former condition assures that the window length is not overrun in the case that the new element has a magnitude that exceeds the magnitude of all other signal samples in the preceding window. Block 1008 assigns the deletion parameter a value of one if the permutation array element referenced by the current value of the insertion spot parameter is equal to one. In block 1010 the insertion spot parameter 'ispot' is incremented, and block 1012 indicates the end of the program loop.

After the preceding program loop, in block 1014 the insertion spot is adjusted by subtracting the deletion parameter 'ndels'. Note that 'ndels' may or may not have been adjusted to one from its original value of zero during the course of execution of loop. Whether, 'ndels' is adjusted depends on whether the insertion spot is found beyond the permutation array element that refers to the element that will be dropped from the new window (i.e., the first element in the preceding window which has a sample position index 1 within the preceding window.) In other words, because the insertion spot is beyond the element that will be dropped the insertion spot in the permutation array shifts to the left to take up the void left by the deleted position index.

In block 1016 a variable 'from' that specifies a position in the permutation array for the current window is initialized at the window length 'ndensities'. In block 1018 if the entry of the permutation array for the current window at positioning 'ndensities' is equal to one, meaning that the last entry in the permutation array points to the signal sample at the beginning of the current sample window which will be shifted out (not included) in the new window, then the variable 'from' is decremented by one in order to skip this entry.

In block 1020 a variable 'to' that specifies a position in the permutation array for the next window is initialized to 'ndensities'. In block 1022 if the insertion spot 'ispot' (determined in blocks 1002-1010) is the last position in the permutation array, then the variable 'to' is decremented by one in order to keep the last position of new permutation array open for the position index referring to the newly added signal sample 'newelement'.

Blocks 1024-1036 form a DO-WHILE program loop. As indicated in block 1024 the loop continues executing while the 'to' variable is greater than zero. In block 1026 the to$^{th}$ element of the permutation array for the new window (denoted 'newindex') is set to the from$^{th}$ element of the permutation array for the current window minus one. (Note as the window shifts there is a general pattern of the permutation array indices decrementing, this pattern is interrupted by the insertion of the new element according to where it falls in the ordering.) In block 1028 the 'from' variable is decremented in preparation for the next run through the program loop. In block 1030 if the 'from' variable is greater than zero and the from$^{th}$ entry of the permutation array for the current window is equal to one, i.e., specifies the signal sample that will be dropped in the new window, then the from variable is decremented in order to skip over the element that will be dropped.

In block 1032 the 'to' variable is decremented in preparation for the next run through the program loop. In block 1034, if the 'to' variable is found to be equal to the insertion spot 'ispot' then the 'to' variable is decremented in order to reserve the insertion spot. Block 1036 marks the end of the program loop 1024-1036.

After the preceding program loop 1024-1036 is exited, in block 1038 the insertion spot 'ispot' element of the permutation array for the new window is set equal to ndensities. Note that because the new window is formed by shifting by one signal sample position, the new signal sample is the last sample in the new window so that the position index of the new signal sample in the new window is equal to the number of samples per window 'ndensities'. In block 1040 the permutation array denoted 'index' is set equal to the newly updated permutation array denoted 'newindex'.

FIG. 3 facilitates understanding of the creation of the permutation array for each successive window from the permutation array from the preceding window which is performed by the sliding window indirect insertion sort. A fourth row 308 in FIG. 3 is the permutation array for a second window which includes samples two to six (according to the numbering in the first row 302). Note that the permutation array includes window position numbers 1 to 5. The arrows illustrate the block of decrementing and copying permutation array entries that is performed in block 1026 in FIG. 10 and block 704 in FIG. 7. Note that relative positioning of the two ends of the arrows depends on the relation between the 'from' index and the 'to' index which is determined in blocks 1018, 1022, 1030, 1034 described above. Note window position number 5 corresponds to the new signal sample in each window and therefore is not obtained by decrementing and copying as performed in blocks 704, 1026. Note also that window position number one is not transferred to successive windows because it points to a sample that will be dropped from the successive window. The fifth through seventh rows 310, 312, 314 show the permutation array for successive windows. As illustrated in FIG. 3 the sliding window indirect insertion sort maintains a permutation array specifying an ordering of the contents of a sliding signal sample window. Moreover, the particular methods, described with reference to FIGS. 7, 10, have a low computational cost allowing for low power consumption and reduced battery drain in portable electronic devices.

It is noted that the sliding window indirect insertion sort is applicable for accelerating any type of digital signal processing filter that treats samples based on position in a magnitude sorting within each window, as opposed to treating samples based on original position within each window (as in classical FIR filters). For example the sliding window indirect insertion sort can be used to accelerate order statistics filters such as an order weighted average filter.

Figure 11:
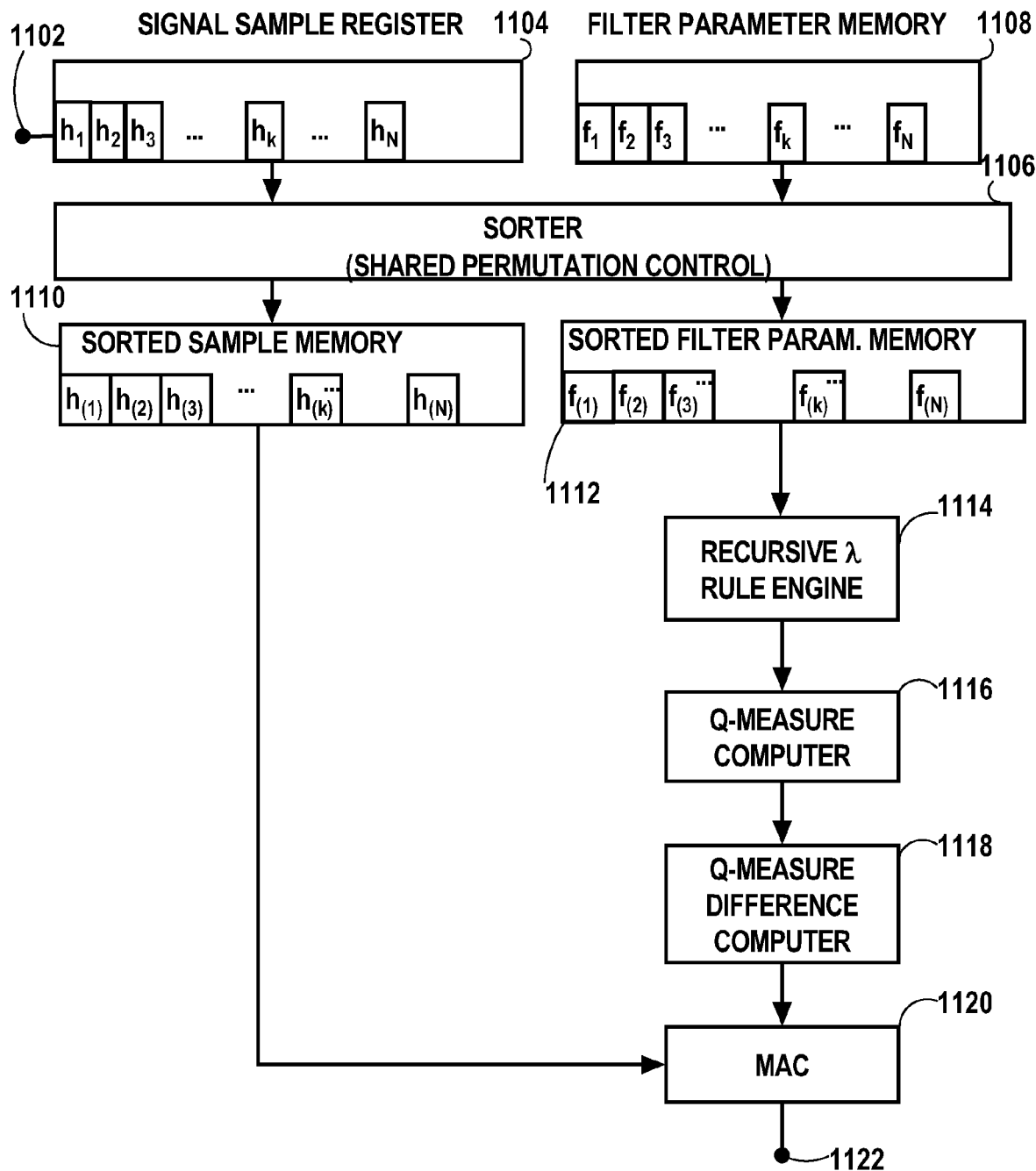
FIG. 11 is a high level hardware block diagram of a fast Q-filter in accordance with some embodiments of the invention.

FIG. 11 is a high level hardware block diagram of a fast Q-filter 1100 in accordance with some embodiments of the invention. Digitized signal samples are received at an input 1102 of a signal sample register 1104. The signal samples can come from an analog-to-digital converter (not shown) or from a signal line or from a memory, for example. The size of the signal sample register 1104 (which is equal to the window size) may be varied by trial and error in order to determine a size that works well for a particular filtering application. Trial and error tests can be conducted using a software implementation of the fast Q-filter, e.g., using the fast Q-filter software shown in FIG. 2.

The signal sample register 1104 is coupled to a sorter 1106. The sorter 1106 can work by permuting signal samples in memory, or by permuting entries in a permutation array, as described above with reference to FIGS. 7, 10. A filter parameter memory 1108 is also coupled to the sorter 1106. A set of filter density generator parameters $[f_1, f_2, f_3 \ldots f_j \ldots f_{ndensities}]$ are stored in the filter parameter memory 1108. The sorter 1106 sorts the signals in the signal sample register 104 in order to obtain a monotonic ordering of the signal samples. The actual signal samples, of the permutation array (if used) can be sorted. The necessary permutations required to obtain the monotonic ordering of the signal samples are also applied to the filter parameters in the filter parameter memory 1108. Thus, for example, if sorting the signal samples requires an exchange of the signal samples in the second and fourth positions of the signal sample register 1104, then the second and fourth filter parameters would also be exchanged (either actually, or virtually, through the use of the permutation array or other mechanism).

As shown in FIG. 11, the sorter 1106 is coupled to a sorted sample memory 1110 and a sorted filter parameter memory 1112. (In some embodiments in which a permutation array is used it is unnecessary to provide the separate sorted sample memory 1110 and the sorter filter parameter memory 1112.) In such cases a permutation array register or memory location may be used. The sorted filter parameter memory 1112 is coupled to a recursive lambda rule engine 1114.

Figure 12:
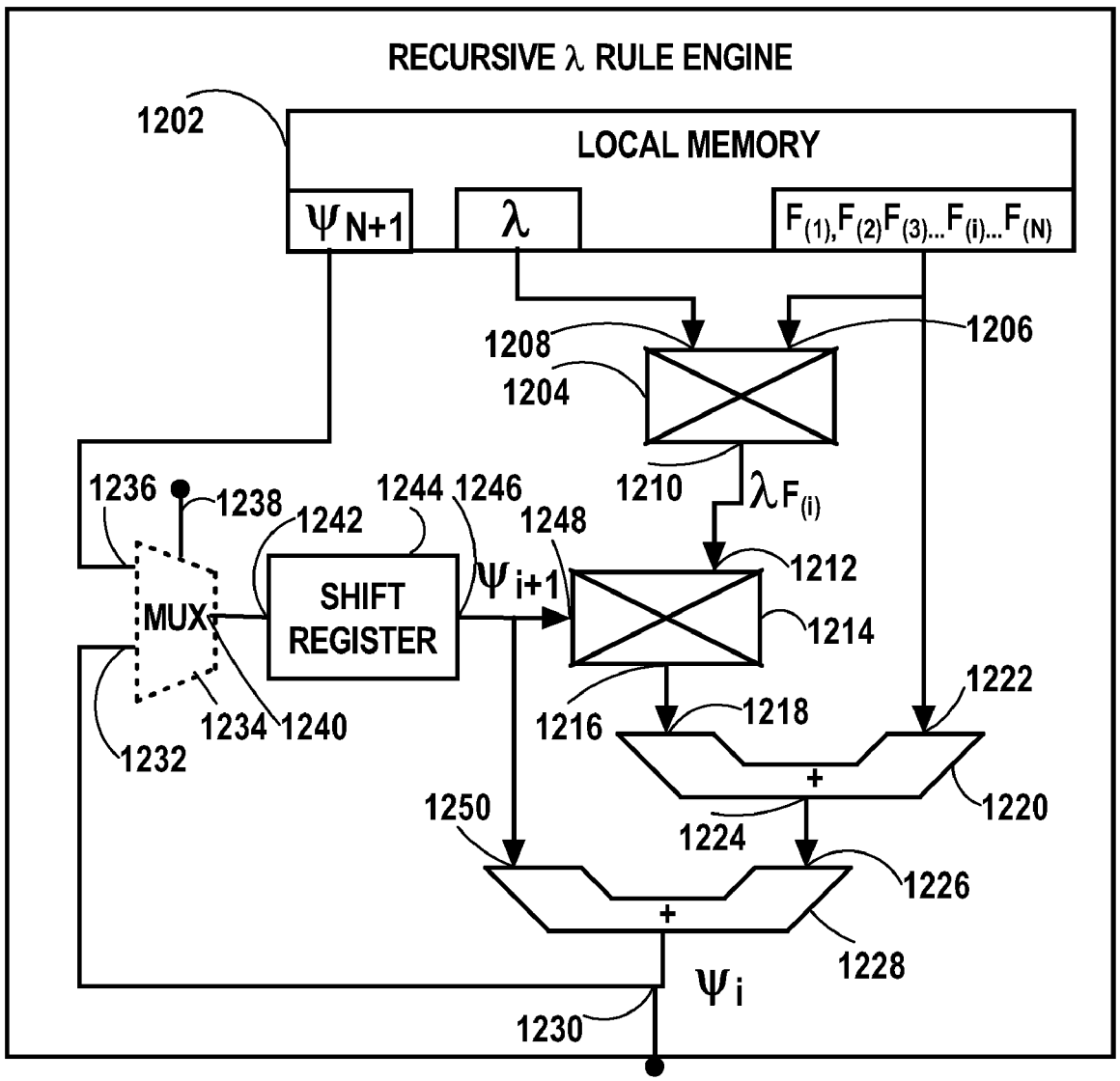
FIG. 12 is a hardware block diagram of the recursive lambda rule engine that is used in the fast Q-filter shown in FIG. 11.

FIG. 12 is a hardware block diagram of the recursive lambda rule engine 1114 that is used in the fast Q-filter shown in FIG. 11. In FIG. 12 a local memory 1202 is shown. The local memory 1202 includes the sorted filter parameter memory 1112. (In some embodiments in which indirect sorting is used, the filter parameters are receive by the recursive lambda rule engine 1114 from the filter parameter memory 1108, in an order dictated by permutation information generated by the sorter 1106, e.g., information encoded in the permutation array.) The local memory 1202 of the recursive lambda rule engine 1114 also includes the additional nonlinearity control parameter λ. The local memory 1202 is coupled to a first multiplier 1204. The filter density generator parameters fi are fed sequentially (in the order dictated by the monotonic ordering of the signal samples) to a first input 1206 of the multiplier 1204. The first multiplier receives the nonlinearity control parameter λ at a second input 1208. The first multiplier 1204 outputs a series of products $\lambda f_{(i)}$ at an output 1210. Note that the index i ranges from one up to the size of the signal sample register N which is also the number of filter parameters, 'ndensities'.

The output 1210 of the first multiplier 1204 is coupled to a first input 1212 of a second multiplier 1214. An output 1216 of the second multiplier 1214 is coupled to a first input 1218 of a first adder 1220. A second input 1222 of the first adder 1220 sequentially receives the sorted filter parameters directly from the local memory 1202. An output 1224 of the first adder 1220 is coupled to a first input 1226 of a second adder 1228.

An output 1230 of the second adder 1228 is coupled to a first input 1232 of a multiplexer 1234. A second input 1236 of the multiplexer 1234 is coupled to the local memory 1202. An initial set function value (e.g., denoted $\Psi_{N+1}$) is stored in the local memory 1202 and received at the second input 1236. A control input 1238 of the multiplexer 1234 determines which of the first input 1232 and second input 1236 is coupled to an output 1240 of the multiplexer 1234. Initially the second input 1236 at which the initial set function value $\Psi_{N+1}$ is received is coupled to the output 1240. For subsequent cycles of operation of the recursive lambda rule engine 1114 the first input 1232 of the multiplexer 1234 which is coupled to the output 1230 of the second adder 1228, is coupled to the output 1240 of the multiplexer 1234 so that the engine 1114 operates in a recursive manner.

The output 1240 of the multiplexer 1234 is coupled to an input 1242 of a shift register 1244. An output 1246 of the shift register 1244 is coupled to a second input 1248 of the second multiplier 1214 and to a second input 1250 of the second adder 1228.

The recursive lambda rule engine 1114 can generate values of the recursion relations given in equation one and equation two. For example, for equation one, during each cycle of operation, the output of the first multiplier is $\lambda f_{(i)}$, the output of the second multiplier 1214 is $\lambda f_{(i)} \Psi_{i+1}$ (the third term in equation 1), the output of the first adder 1220 is $f_{(i)} + \lambda f_{(i)} \Psi_{i+1}$, and the output of the second adder 1228 is $\Psi_{i+1} + f_{(i)} + \lambda f_{(i)} \Psi_{i+1}$. Note that the recursion relation specified by equation 1 starts with $\Psi_{n+1}$ and works backwards, thus the filter density generator parameters are used in reverse order.

The values generated by the recursive lambda rule engine 1114 are passed to a Q-measure computer 1116 (see FIG. 11). The Q-measure computer 1116 generates a new set of function values by dividing each of the set function values output by the recursive lambda rule engine 1114 by the largest set function value, which in the case of the set given by equation 1 is $\Psi_1$. (In other words the function values are normalized.) The function computed by the Q-measure computer is called a Q-measure. The Q-measure function values are bounded within the interval (0,1). The Q-measures are given by the following equation.

$$q_i = \Psi_i / \Psi_1 \quad \text{EQU. 4}$$

The Q-measures computed by the Q-measure computer 1116 are passed to a Q-measure difference computer 1118. The Q-measure difference computer calculates the differences between successive Q-measures. The differences are expressed by the following equation.

$$\Delta q_i = q_i - q_{i+1} \quad \text{EQU. 5}$$

Note that the sum of the differences is equal to one. The differences are passed to a multiply-and-accumulate block (MAC) 120. The MAC computes the inner product of the differences output by the Q-measure difference computer 1118 and the sorted signal samples. Because the processing performed in the Q-measure computer 1116 and the Q-measure difference computer 1118 leads to a set of differences, the sum of which is equal to one, nonlinear signal processing is accomplished without the need to rescale the output of the fast Q-filter. Output of the fast Q-filter 1100 is provided at an output 1122 of the MAC 1120. Alternatively division by $\Psi_1$ which is performed by the Q-measure computer 1116 is placed after the MAC 1120.

Despite the use of the MAC 1120 at the final stage of the fast Q-filter 1100, the fast Q-filter is fundamentally different in nature from the common Finite Impulse Response (FIR) filter which also uses a MAC. One important difference is that signal samples are associated with filter coefficients (e.g., the differences given by equation 3) based on amplitude sorting not based on position in a sample window. Another important difference is that the filter coefficients change (adapt) depending on the permutations required to sort the signal samples because the order in which the filter parameters are used in equation 2 changes. Yet, another important difference is that rather than being based on frequency analysis and transform methods the fast Q-filter is a signal estimator that may be explained in terms of fuzzy measure theory.

Figure 13:
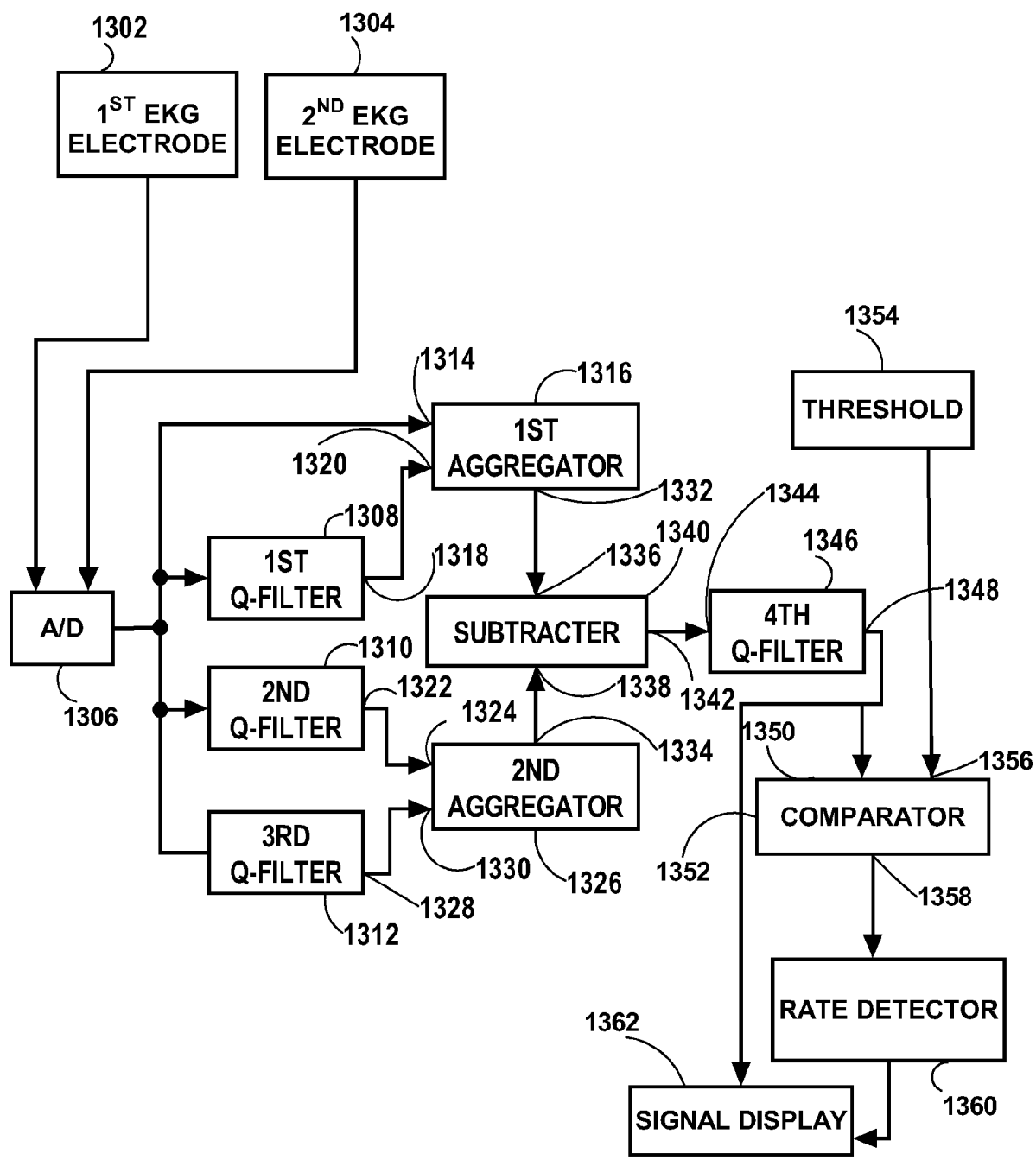
FIG. 13 is a block diagram of a system for processing EKG signals that uses several fast Q-filters.

FIG. 13 is a block diagram of a heart beat signal processing system 1300 that uses fast Q-filters. The system 1300 has a first Electrocardiogram (EKG) electrode 1302 and a second EKG electrode 1304 for sensing a patients heart beat. The EKG electrodes 1302, 1304 are coupled to an A/D 1306. A first fast Q-filter 1308, a second fast Q-filter 1310 and a third fast Q-filter 1312 are coupled to the A/D 1306 and receive the heart beat signal from the A/D 1306. The A/D 1306 is also coupled to a first input 1314 of a first aggregator 1316. An output 1318 of the first fast Q-filter 1308 is coupled to a second input 1320 of the first aggregator 1316. An output 1322 of the second fast Q-filter 1310 is coupled to a first input 1324 of a second aggregator 1326. An output 1328 of the third fast Q-filter 1312 is coupled to a second input 1330 of the second aggregator 1326.

Each of the signal aggregators 1316, 1326 is modeled by the following equation:

$$A_\lambda(a_1, \ldots, a_n) = \begin{cases} \dfrac{\prod_{i=1}^{n}(1+\lambda a_i) - 1}{\prod_{i=1}^{n}(1+\lambda) - 1} & \lambda \geq -1, \lambda \neq 0 \\ \dfrac{1}{n}\sum_{i=1}^{n} a_i & \lambda = 0 \end{cases} \quad \text{EQU. 6}$$

where, $\lambda_A \geq -1$ is a nonlinearity control parameter that is used to configure the aggregators;

$a_k \in [0,1]$ is a $k^{th}$ input to the aggregator;

n is a number of inputs; and $A_\lambda(a_1, \ldots, a_n) \in [0,1]$ is the output of the aggregator.

Setting the nonlinearlity control parameter $\lambda_A$ to a high number e.g., one-hundred causes each signal aggregator 1316, 1326 to emulate a MIN or infinite logic INTERSECTION operation; setting the control parameter $\lambda_A$ to values approaching zero e.g. 0.001 causes each signal aggregator 1316, 1326 to emulate a signal averager; and setting the control parameter $\lambda_A$ to negative one causes each signal aggregator 1316, 1326 to emulate a MAX or infinite logic UNION operation. By varying the parameter $\lambda_A$ the aggregators 1316, 1326 can be made to smoothly vary between the foregoing configurations passing through various intermediate configurations. $\lambda_A$ may be automatically adjusted by a supervisory system until a value that produces a desirable output is reached.

The signal aggregators 1316, 1326 can be implemented as a programmed processor, or an Application Specific Integrated Circuit (ASIC), or a Field Programmable Gate Array (FPGA) configured to perform the aggregator function.

An output 1332 of the first aggregator 1316 and an output 1334 of the second aggregator 1326 are coupled to a first input 1336 and a second input 1338, respectively, of a signal subtracter 1340. The signal subtracter 1340 is covered in copending patent application Ser. No. 11/554,674 by Magdi Mohamed and Weimin Xiao which assigned to the assignee of the invention described herein and filed concurrently with the present application. The signal subtracter 1340 is a versatile reconfigurable means for combining two information bearing signals.

Referring again to FIG. 13, an output 1342 of the subtracter 1340 is coupled to an input 1344 of a fourth fast Q-filter 1346. An output 1348 of the fourth Q-filter 1346 is coupled to a first input 1350 of a comparator 1352. A threshold signal generator 1354 is coupled to a second input 1356 of the comparator 1352. An output 1358 of the comparator 1352 is coupled to a rate detector 1360. The rate detector 1360 is coupled to a display 1362. The output 1348 of the fourth fast Q-filter 1346 is also coupled to the display 1362 so that both the time series output by the fourth fast Q-filter and the rate output by the rate detector 1360 are displayed on the display 1362.

Figure 14:
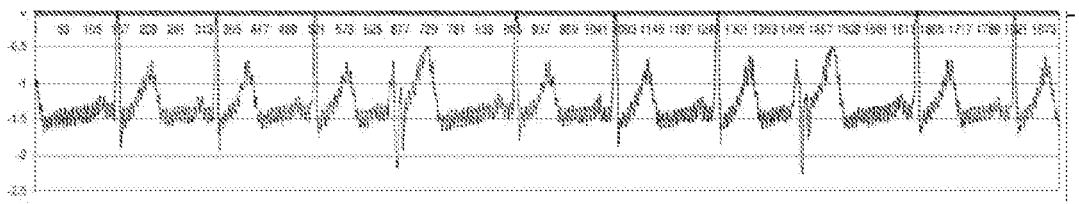
FIG. 14 is an unprocessed EKG signal.
Figure 15:
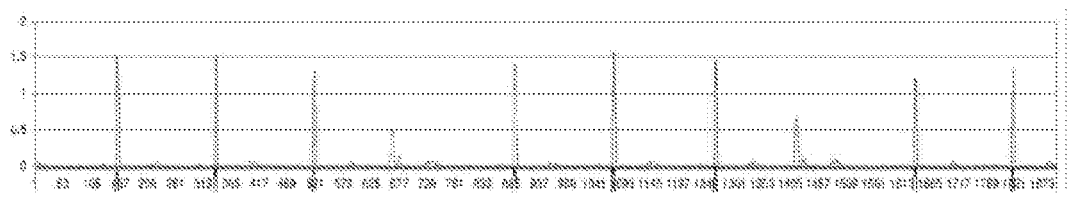
FIG. 15 shows an output of the system shown in FIG. 11 generated in response to the EKG shown in FIG. 12.

FIG. 14 is a signal trace of a heart beat signal 1400 used to test the system shown in FIG. 13. The objective for the system 1300 is to process the heart beat signal 1400 and produce a simplified signal that includes one signal pulse for each heart beat. FIG. 15 is a signal 1500 output by the fourth Q-filter 1346 in the system 1300 shown in FIG. 13 in response to the heart beat signal shown in FIG. 14. As shown in FIG. 15 the system produces signal spikes for each heart beat. The comparator 1352 produces a simple binary signal with one pulse per heart beat in response to the signal shown in FIG. 14.

Figure 16:
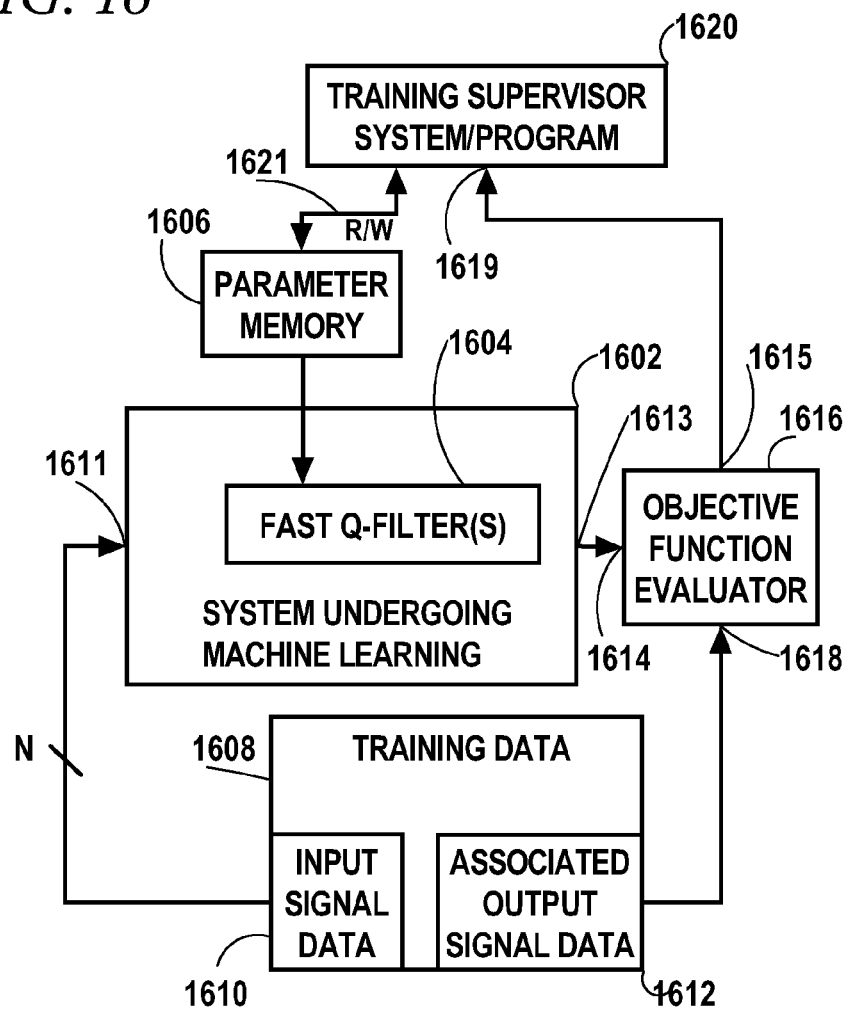
FIG. 16 is a high level block diagram of a machine learning system that uses one or more fast Q-filters.

FIG. 16 is a high level block diagram of a machine learning system 1600 that uses one or more of the fast Q-filters 1604 of the type shown in FIG. 1. The machine learning system 1600 includes a processing system 1602 that can be trained in the machine learning system 1600. The processing system 1602 can be, for example, a statistical pattern recognition system, a genetic algorithm type system, a neural network system or some other type of signal processing system. The processing system 1602 can, for example, be used for pattern recognition or data mining applications. One example of the processing system 1602 is the heart beat signal processing system 1300 shown in FIG. 13. The processing system 1602 includes one or more fast Q-filters 1604 of the type shown in FIG. 1 and described above. The fast Q-filters 1604 are used to filter signals at intermediate stages within the processing system 1602. The filter defining parameters $\lambda$, $F_J$ of the fast Q-filters 1604, which are stored in a parameter memory 1606, are not fixed. The parameter memory 1606 is coupled to the fast Q-filters 1604. The filter defining parameters $\lambda$, $F_J$ are set in the course of machine learning. If the processing system 1602 includes one or more aggregators then the aggregator control parameters can also be set in the course of machine learning. The machine learning system 1600 also includes a training data memory 1608. The training data memory and the parameter memory 1606 can be implemented in a single physical memory or in physically separate memories. The training data memory 1608 stores training data that includes input signal data 1610 and associated output signal data 1612. The input signal data 1610 includes data for each of N inputs of the processing system. The number of inputs is typically related to a number of sensors, or the resolution of sensors with which the processing system 1602 is to be used after the processing system 1602 has been trained in the machine learning system 1600. The training data memory 1608 suitably stores many sets of training data (e.g., many EKG signals) spread throughout a entire range of values of inputs that the processing system 1602 is expected to encounter in actual use. The input signal data 1610 is fed into an input 1611 of the processing system 1602 which processes the input signal data to produce an output 1613 of the processing system 1602. The output 1613 of the processing system 1602 is input into a first input 1614 of an objective function evaluator 1616. The associated output signal data 1612 component of the training data is input into a second input 1618 of the objective function evaluator 1616. The objective function evaluator 1616 suitably evaluates a function that depends on the difference between the associated output signal data 1612 component of the training data and the output 1613 of the processing system 1602 that is produced in response to the input signal data 1610. An output 1615 of the objective function evaluator 1616 is coupled to an input 1619 of a training supervisor 1620. The training supervisor 1620 is coupled to the parameter memory 1606 through a read/write coupling 1621, allowing the training supervisor 1620 to read and update the filter defining parameters $\lambda$, $F_J$. The training supervisor 1420 suitably implements an optimization strategy such as, for example, the conjugate gradient method, simulated annealing, differential evolution, or another direct-search method. The training supervisor system 1620 adjusts one or more of the filter defining parameters $\lambda$, $F_J$ stored in the parameter memory 1606 according to the optimization strategy until a stopping criteria is met. The goal of optimization is to reduce the difference between the output of the processing system 1602 and the associated output signal data 1612 component of the training data 1608. Thus, the stopping criteria is based, at least in part, on the aforementioned difference. When the stopping criteria is met, a set of final values of the variable filter defining parameters $\lambda$, $F_J$ are suitably stored for future use by the processing system 1602. The system 1600 is most readily implemented in software. However, for mass production it may be more economical to duplicate the processing system 1602 in hardware after the filter defining parameter $\lambda$, $F_J$ have been determined using the machine learning system 1600. In the case that the processing system 1602 is the heart beat signal processing system 1300, the control parameter AA of the aggregator can be simultaneously determined in the machine learning system. In the case that the processing system includes other parameters these can also be determined in the machine learning system.

Using the fast Q-filters allows the machine learning system to make qualitative changes in the manner in which signals are processed in the processing system 1602 by making adjustments to the filter defining parameters $\lambda$, $F_J$.

Co-pending patent application Ser. No. 11/554,651 entitled "Automatatic Signal Processor Design Software System" by Weimin Xiao et al. discloses a method for designing the architecture of the signal processing networks that use fast Q-filters and Q-aggregators using genetic programming and establishing filter parameter values using numerical optimization, e.g., a differential evolution, genetic evolution hybrid method.

An extension of the concepts illustrated here can be performed for filtering digital image data where the sliding window is represented by a two dimensional array (3 by 3 for example) and the insertion and deletion operations are performed on columns/rows, accordingly. Filtering operations to higher dimensional input data can also be extended in a similar manner.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any elements that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A method of adaptive nonlinear digital filtering comprising:
 receiving a first set of filter defining parameters;
 receiving an additional filter nonlinearity defining parameter;
 receiving a sequence of signal values;
 selecting a sequence of windows of signal values from said sequence of signal values, wherein each window comprises a set of signal values;
 for each particular window of said sequence of windows of signal values:
  obtaining permutation information that describes a monotonic ordering of said set of signal values in said particular window;
  initializing at least one of a sequence of derived adaptive filter parameters;
  recursively deriving others of said sequence of derived adaptive filter parameters from said at least one of said sequence of derived adaptive filter parameters, said first set of filter defining parameters, and said additional filter nonlinearity defining parameter wherein, in recursively deriving said others of said sequence of derived adaptive filter parameters, said first sequence of filter defining parameters are used in an order determined by said permutation information;
  obtaining an output value by accumulating a product of a first factor including a difference between each two successive derived adaptive filter parameters and a second factor including a signal value in said particular window, wherein said signal values are taken in an order determined by said permutation information.

2. The method according to claim 1 further comprising:
 normalizing said output value by dividing said output value by a largest of said sequence of derived adaptive filter parameters.

3. The method according to claim 1 wherein:
 said permutation information comprises a permutation array;
 each window has a number of samples and each window after an initial window of said sequence of windows of signal values is obtained by shifting a preceding window by one sample position in said sequence of signal values; and
 for, at least each new window after said initial window, obtaining said permutation array comprises:
  receiving a new signal sample from said sequence of signal samples;
  initializing an insertion spot variable to one;
  initializing a deletion variable to zero;
  while said insertion spot variable is less than the number of samples in said set of samples and until an insertion spot for said new signal sample in said permutation array that maintains said monotonic ordering is located:
   checking if an entry of said permutation array having a position indicated by said insertion spot variable points to a signal value that is included in said preceding window but will be dropped from said new window, and if so, setting said deletion variable to one; and
   incrementing said insertion spot variable;
  subtracting said deletion variable from said insertion spot variable;
  initializing a 'from' variable, that indicates position in said permutation array for said preceding window, to said number of samples;

checking if a last entry of said permutation array, having a position corresponding to said number of samples, points to said signal value that is included said preceding window but will be dropped from said new window, and if so, decrementing said 'from' variable by one;

initializing a 'to' variable, that indicates position in said permutation array for said new window, to said number of samples;

checking if said insertion spot parameter indicates said last entry of said permutation array, and if so decrementing said 'to' variable by one;

while said 'to' variable is greater than zero:
assigning each to$^{th}$ element of said permutation array for said new window a from$^{th}$ element of said permutation array for said preceding window minus one;

decrementing said 'from' variable by one;

checking if said 'from' variable is greater than zero and said from$^{th}$ entry of said permutation array for said preceding window points to said signal sample that will be dropped from said new window, and if so decrementing said 'from' variable by one;

decrementing said 'to' variable by one;

checking if said 'to' variable is equal to said insertion spot parameter, and if so decrementing said 'to' variable by one;

storing said permutation array for said new window.

4. The method according to claim 1 wherein:

said permutation information comprises a permutation array;

each window has a number of samples and each window after an initial window of said sequence of windows of signal values is obtained by sliding a preceding window by one sample position in said sequence of signal values; and for, at least each new window after said initial window, obtaining said permutation array comprises:

decrementing entries in said permutation array by one;

deleting an entry in said permutation array for a signal sample that was dropped by sliding said window;

shifting entries beyond entry for signal sample that was deleted back by one position to take up room left by deleted entry;

finding a position for index referring to signal sample that was added by sliding said window that maintains said monotonic ordering;

shifting entries beyond said found position in order to make room for insertion;

inserting index referring to new sample into permutation array.

5. The method according to claim 1 wherein iteratively deriving others of said sequence of derived filter parameters comprises:

said permutation information comprises a permutation array;

evaluating a recursion relation:

$$\Psi_i = F(\text{Index}(i)) + \Psi_{i+1} + \lambda F(\text{Index}(i))\Psi_{i+1}$$

where, $\Psi_i$ is an i$^{th}$ derived adaptive filter parameter
Index(i) is an i$^{th}$ entry of said permutation array;
F(Index(i))∈[0,1] is one of said first set of filter defining parameters; and
$\lambda >= -1$ is said additional filter nonlinearity defining parameter.

6. A method of maintaining a permutation array for a sliding window of signal samples, wherein said permutation array describes a monotonic ordering of said window of signal samples, the method comprising:

sliding said sliding window by one signal sample position;

decrementing entries in said permutation array by one;

deleting an entry in said permutation array for a signal sample that was dropped by sliding said window;

shifting entries beyond entry for signal sample that was deleted back by one position to take up room left by deleted entry;

finding a position for index referring to signal sample that was added by sliding said window that maintains said monotonic ordering;

shifting entries beyond said found position in order to make room for insertion;

inserting index referring to new sample into permutation array.

7. A method of digital signal filtering that uses the permutation maintained by the method recited in claim 6, the method of digital signal filtering further comprising:

obtaining a set of filter coefficients obtaining a window of signal values;

computing an inner product of said filter coefficients and said window of signal values, wherein said signal values are used in said inner product in an order determined by said permutation array;

outputting an output based on said inner product as a filtered signal value.

8. A method of maintaining a permutation array for a sliding window of signal samples, wherein said permutation array describes a monotonic ordering of said window of signal samples, the method comprising:

initializing an insertion spot variable to one;

initializing a deletion variable to zero;

while said insertion spot variable is less than a number of samples in said window of signal samples and until an insertion spot for said new signal sample in said permutation array that maintains said monotonic ordering is located:

checking if an entry of said permutation array having a position indicated by said insertion spot variable points to a signal value that is included in a preceding window but will be dropped as said window is slid, and if so, setting said deletion variable to one; and incrementing said insertion spot variable;

subtracting said deletion variable from said insertion spot variable;

initializing a 'from' variable, that indicates position in said permutation array for said preceding window, to said number of samples;

checking if a last entry of said permutation array, having a position corresponding to said number of samples, points to said signal value that is included said preceding window but will be dropped from a new window obtained by sliding said preceding window, and if so, decrementing said 'from' variable by one;

initializing a 'to' variable, that indicates position in said permutation array for said new window, to said number of samples;

checking if said insertion spot parameter indicates said last entry of said permutation array, and if so decrementing said 'to' variable by one;

while said 'to' variable is greater than zero:

assigning each to$^{th}$ element of said permutation array for said new window a from$^{th}$ element of said permutation array for said preceding window minus one;

decrementing said 'from' variable by one;

checking if said 'from' variable is greater than zero and said from$^{th}$ entry of said permutation array for said preceding window points to said signal sample that will be dropped from said new window, and if so decrementing said 'from' variable by one;

decrementing said 'to' variable by one;

checking if said 'to' variable is equal to said insertion spot parameter, and if so decrementing said 'to' variable by one;

storing said permutation array for said new window.

9. A method of digital signal filtering that uses the permutation maintained by the method recited in claim 8, the method of digital signal filtering further comprising:

obtaining a set of filter coefficients obtaining a window of signal values;

computing an inner product of said filter coefficients and said window of signal values, wherein said signal values are used in said inner product in an order determined by said permutation array;

outputting an output based on said inner product as a filtered signal value.

10. A digital signal filter comprising:

a processor;

a program memory, storing a digital signal filter program, coupled to said processor, wherein said processor is programmed by said digital signal filter program to:

receive a first set of filter defining parameters;

receive an additional filter nonlinearity defining parameter;

receive a sequence of signal values;

select a sequence of windows of signal values from said sequence of signal values, wherein each window comprises a set of signal values;

for each particular window of said sequence of windows of signal values:

obtain a permutation array that describes a monotonic ordering of said set of signal values in said particular window;

initialize at least one of a sequence of derived adaptive filter parameters;

recursively derive others of said sequence of derived adaptive filter parameters from said at least one of said sequence of derived adaptive filter parameters, said first set of filter defining parameters, and said additional filter nonlinearity defining parameter wherein, in recursively deriving said others of said sequence of derived adaptive filter parameters, said first sequence of filter defining parameters are used in an order determined by said permutation array;

obtain an output value by accumulating a product of a first factor including a difference between each two successive derived adaptive filter parameters and a second factor including a signal value in said particular window, wherein said signal values are taken in an order determined by said permutation array.

11. The digital signal filter according to claim 10 wherein said processor is further programmed by said digital signal filter program to:

normalize said output value by dividing said output value by a largest of said sequence of derived adaptive filter parameters.

12. The digital signal filter according to claim 10 wherein:

each window has a number of samples and each window after an initial window of said sequence of windows of signal values is obtained by shifting a preceding window by one sample position in said sequence of signal values; and for, at least each new window after said initial window, said processor is programmed to obtain said permutation array by:

receiving a new signal sample from said sequence of signal samples;

initializing an insertion spot variable to one;

initializing a deletion variable to zero;

while said insertion spot variable is less than the number of samples in said set of samples and until an insertion spot for said new signal sample in said permutation array that maintains said monotonic ordering is located:

checking if an entry of said permutation array having a position indicated by said insertion spot variable points to a signal value that is included in said preceding window but will be dropped from said new window, and if so, setting said deletion variable to one; and incrementing said insertion spot variable;

subtracting said deletion variable from said insertion spot variable;

initializing a 'from' variable, that indicates position in said permutation array for said preceding window, to said number of samples;

checking if a last entry of said permutation array, having a position corresponding to said number of samples, points to said signal value that is included said preceding window but will be dropped from said new window, and if so, decrementing said 'from' variable by one;

initializing a 'to' variable, that indicates position in said permutation array for said new window, to said number of samples;

checking if said insertion spot parameter indicates said last entry of said permutation array, and if so decrementing said 'to' variable by one;

while said 'to' variable is greater than zero:

assigning each to$^{th}$ element of said permutation array for said new window a from$^{th}$ element of said permutation array for said preceding window minus one;

decrementing said 'from' variable by one;

checking if said 'from' variable is greater than zero and said from$^{th}$ entry of said permutation array for said preceding window points to said signal sample that will be dropped from said new window, and if so decrementing said 'from' variable by one;

decrementing said 'to' variable by one;

checking if said 'to' variable is equal to said insertion spot parameter, and if so decrementing said 'to' variable by one;

storing said permutation array for said new window.

13. The digital signal filter according to claim 10 wherein:

each window has a number of samples and each window after an initial window of said sequence of windows of signal values is obtained by sliding a preceding window by one sample position in said sequence of signal values; and for, at least each new window after said initial window, said processor is programmed to obtain said permutation array by:

decrementing entries in said permutation array by one;

deleting an entry in said permutation array for a signal sample that was dropped by sliding said window;

shifting entries beyond entry for signal sample that was deleted back by one position to take up room left by deleted entry;

finding a position for index referring to signal sample that was added by sliding said window that maintains said monotonic ordering;

shifting entries beyond said found position in order to make room for insertion;

inserting index referring to new sample into permutation array.

14. The digital signal filter according to claim 10 wherein iteratively deriving others of said sequence of derived filter parameters comprises:

evaluating a recursion relation:

$$\Psi_i = F(\text{Index}(i)) + \Psi_{i+1} + \lambda F(\text{Index}(i))\Psi_{i+1},$$

where, $\Psi_i$ is an $i^{th}$ derived adaptive filter parameter

Index(i) is an ith entry of said permutation array;

$F(\text{Index}(i)) \in [0,1]$ is one of said first set of filter defining parameters; and $\lambda >= -1$ is said additional filter nonlinearity defining parameter.

15. A computer readable medium storing programming instructions for maintaining a permutation array for a sliding window of signal samples, wherein said permutation array describes a monotonic ordering of said window of signal samples, including programming instructions for:

sliding said sliding window by one signal sample position;

decrementing entries in said permutation array by one;

deleting an entry in said permutation array for a signal sample that was dropped by sliding said window;

shifting entries beyond entry for signal sample that was deleted back by one position to take up room left by deleted entry;

finding a position for index referring to signal sample that was added by sliding said window that maintains said monotonic ordering;

shifting entries beyond said found position in order to make room for insertion;

inserting index referring to new sample into permutation array.

16. A computer readable medium storing programming instructions for digital signal filtering that uses the permutation maintained by the programming instructions recited in claim 15, and further including programming instructions for:

obtaining a set of filter coefficients obtaining a window of signal values;

computing an inner product of said filter coefficients and said window of signal values, wherein said signal values are used in said inner product in an order determined by said permutation array;

outputting an output based on said inner product as a filtered signal value.

17. A computer readable medium storing programming instructions for maintaining a permutation array for a sliding window of signal samples, wherein said permutation array describes a monotonic ordering of said window of signal samples, including programming instructions for:

initializing an insertion spot variable to one;

initializing a deletion variable to zero;

while said insertion spot variable is less than a number of samples in said window of signal samples and until an insertion spot for said new signal sample in said permutation array that maintains said monotonic ordering is located:

checking if an entry of said permutation array having a position indicated by said insertion spot variable points to a signal value that is included in a preceding window but will be dropped as said window is slid, and if so, setting said deletion variable to one; and incrementing said insertion spot variable;

subtracting said deletion variable from said insertion spot variable;

initializing a 'from' variable, that indicates position in said permutation array for said preceding window, to said number of samples;

checking if a last entry of said permutation array, having a position corresponding to said number of samples, points to said signal value that is included said preceding window but will be dropped from a new window obtained by sliding said preceding window, and if so, decrementing said 'from' variable by one;

initializing a 'to' variable, that indicates position in said permutation array for said new window, to said number of samples;

checking if said insertion spot parameter indicates said last entry of said permutation array, and if so decrementing said 'to' variable by one;

while said 'to' variable is greater than zero:

assigning each to$^{th}$ element of said permutation array for said new window a from$^{th}$ element of said permutation array for said preceding window minus one;

decrementing said 'from' variable by one;

checking if said 'from' variable is greater than zero and said from$^{th}$ entry of said permutation array for said preceding window points to said signal sample that will be dropped from said new window, and if so decrementing said 'from' variable by one;

decrementing said 'to' variable by one;

checking if said 'to' variable is equal to said insertion spot parameter, and if so decrementing said 'to' variable by one;

storing said permutation array for said new window.

18. A computer readable medium storing programming instructions for digital signal filtering that uses the permutation maintained by the programming instructions recited in claim 17, and further including programming instructions for:

obtaining a set of filter coefficients obtaining a window of signal values;

computing an inner product of said filter coefficients and said window of signal values, wherein said signal values are used in said inner product in an order determined by said permutation array;

outputting an output based on said inner product as a filtered signal value.

* * * * *